US007880233B2

(12) United States Patent
Park

(10) Patent No.: US 7,880,233 B2
(45) Date of Patent: Feb. 1, 2011

(54) TRANSISTOR WITH RAISED SOURCE AND DRAIN FORMED ON SOI SUBSTRATE

(75) Inventor: Jeong Ho Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/579,444

(22) Filed: Oct. 15, 2009

(65) Prior Publication Data

US 2010/0090279 A1     Apr. 15, 2010

Related U.S. Application Data

(62) Division of application No. 11/615,796, filed on Dec. 22, 2006, now Pat. No. 7,622,337.

(30) Foreign Application Priority Data

Dec. 29, 2005   (KR) .................. 10-2005-0133430

(51) Int. Cl.
*H01L 29/786* (2006.01)

(52) U.S. Cl. .............. 257/354; 257/347; 257/353; 257/623; 257/E29.255; 257/E21.545; 257/E21.561; 257/E21.622

(58) Field of Classification Search ......... 257/347–354, 257/623, E29.255, E29.285, E29.286, E29.287, 257/E29.295, E21.545, E21.561, E21.564, 257/E21.619, E21.622, E29.55

See application file for complete search history.

(56) References Cited

U.S. PATENT DOCUMENTS

| | | | | |
|---|---|---|---|---|
| 5,773,331 A * | 6/1998 | Solomon et al. | ............ | 438/164 |
| 7,005,302 B2 * | 2/2006 | Xiang | ............ | 438/3 |
| 7,205,185 B2 * | 4/2007 | Dokumaci et al. | ............ | 438/197 |
| 7,247,910 B2 * | 7/2007 | Lee et al. | ............ | 257/347 |
| 2004/0209438 A1 | 10/2004 | Saito et al. | | |
| 2006/0011984 A1 * | 1/2006 | Currie | ............ | 257/352 |
| 2006/0138542 A1 * | 6/2006 | Xiang | ............ | 257/347 |
| 2007/0224837 A1 * | 9/2007 | Sugawara et al. | ............ | 438/770 |
| 2009/0148989 A1 * | 6/2009 | Tanaka et al. | ............ | 438/239 |
| 2010/0022081 A1 * | 1/2010 | Nansei | ............ | 438/591 |

OTHER PUBLICATIONS

Quirk et al., "Semiconductor Manufacturing Technology", 2001, Prentice Hall, pp. 289.*

* cited by examiner

*Primary Examiner*—Matthew C Landau
*Assistant Examiner*—Joseph C Nicely
(74) *Attorney, Agent, or Firm*—Sherr & Vaughn, PLLC

(57) ABSTRACT

Embodiments relate to a method for fabricating a transistor by using a SOI wafer. A gate insulation layer and a first gate conductive layer on a silicon-on-insulator substrate of a substrate to form a first gate conductive pattern, a gate insulation layer pattern, and a silicon layer pattern. A device isolation insulation layer exposing the top surface of the first gate conductive layer pattern may be formed. A second gate conductive layer may be formed. A mask pattern may be formed. Then, a gate may be formed by etching. After forming a source and drain conductive layer on the silicon layer pattern, the mask pattern may be removed. A salicide layer may be selectively contacting the gate and the source and drain conductive layer may be formed.

14 Claims, 4 Drawing Sheets

US 7,880,233 B2

TRANSISTOR WITH RAISED SOURCE AND DRAIN FORMED ON SOI SUBSTRATE

CROSS REFERENCE TO PRIOR APPLICATIONS

The present application is a Divisional Application of U.S. patent application Ser. No. 11/615,796 (filed on Dec. 22, 2006 now U.S Pat. No. 7,622,337), which claims priority under 35 U.S.C. §119 and 35 U.S.C. §365 to Korean Patent Application No. 10-2005-0133430 (filed on Dec. 29, 2005), which is hereby incorporated by reference in its entirety.

BACKGROUND

In a related art method of manufacturing transistors, a device isolation oxide layer and a source/drain region may be disposed in a silicon Si substrate, and may from a transistor structure. Accordingly, since the source/drain region may be disposed below the silicon substrate, it may be difficult to reduce a source/drain resistance.

Moreover, since a device isolation oxide layer may be formed by a shallow trench isolation (STI) process, transistor device characteristics may degrade due to an influence of stress caused by the STI process. In addition, a divot phenomenon, e.g., an abnormal hump phenomenon that may be caused by a wrap around phenomenon of a wafer, may occur and it may be difficult to control a leakage current caused by a STI edge.

A transistor device that may reduce a source/drain resistance and a leakage current to obtain device reliability may be beneficial.

SUMMARY

Embodiments relate to a semiconductor device. Embodiments relate to more particularly, to a method for fabricating a transistor by using a SOI wafer.

In embodiments, a method for fabricating a transistor of a semiconductor device may reduce a source/drain resistance and a leakage current and may obtain device reliability.

According to embodiments, a source/drain region may be formed on a silicon substrate. Performance may be improved by reducing a source/drain resistance, and cost of stress due to shallow trench isolation (STI) may be reduced. Moreover, device reliability may be achieved, and a leakage current by a STI edge during an STI process may be reduced by preventing a divot phenomenon caused by a related art STI process.

According to embodiments, a method for fabricating a transistor by using a silicon-on-insulator wafer may include forming a gate insulation layer and a first gate conductive layer on a silicon-on-insulator substrate of a substrate, a middle insulation layer, and a silicon layer, may be selectively etching the first gate conductive layer, the gate insulation layer, and the silicon layer to form a first gate conductive pattern, a gate insulation layer pattern, and a silicon layer pattern, forming a device isolation insulation layer exposing the top surface of the first gate conductive layer pattern, forming a second gate conductive layer on the first gate conductive layer pattern, forming a mask pattern on the second gate conductive layer, etching the second gate conductive layer, the first gate conductive layer pattern, and the gate insulation layer pattern exposed by the mask pattern to form a gate may be patterned from the second gate conductive layer and the first gate conductive layer pattern, forming a spacer on a sidewall of the gate, the spacer exposing the silicon layer pattern, forming a source and drain conductive layer on the exposed silicon layer pattern, removing the mask pattern to expose the gate, and forming a salicide layer may be selectively contacting the gate and the source and drain conductive layer.

According to embodiments, the formation of the device isolation insulation layer may include forming an insulation layer covering the first gate conductive layer pattern in a thickness of 2000 to 5000 Å, and performing chemical mechanical polishing on the insulation layer to expose the top surface of the first gate conductive layer pattern.

According to embodiments, the etching for the gate may use the gate insulation layer pattern as an etching stop layer.

According to embodiments, the formation of the source and drain conductive layer may include depositing a conductive layer covering the mask pattern, performing chemical mechanical polishing on the conductive layer by using the mask pattern as a polishing stop layer, and etching the conductive layer for recess to expose the top surface of the device isolation insulation layer.

According to embodiments, the gate and the source and drain conductive layer may be may be formed of a polysilicon layer. The salicide layer may be may be formed of one of Ti-based salicide, Co-based salicide, Ta-based salicide, and Ni-based salicide.

According to embodiments, a method for fabricating a transistor device may be capable of reducing a source/drain resistance and a leakage current and may obtain device reliability.

DETAILED DESCRIPTION OF THE INVENTION

Figure 1:
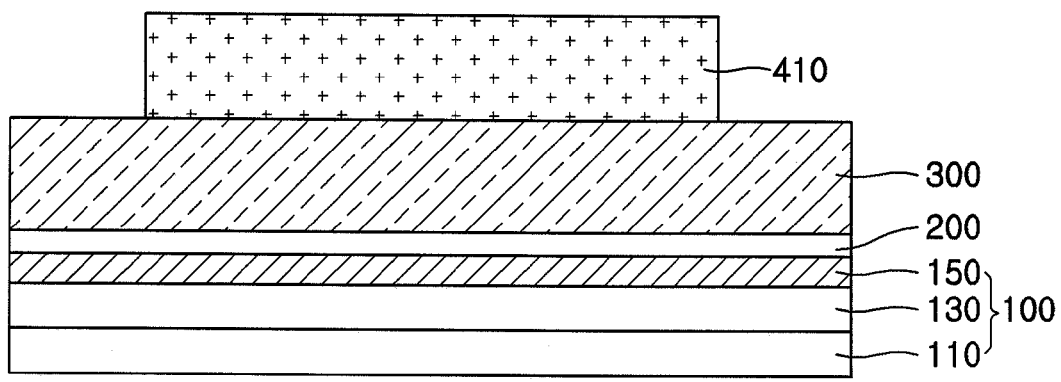
FIGS. 1 through 8 are example diagrams illustrating a semiconductor and a method for fabricating a transistor according to embodiments.

Referring to FIG. 1, gate insulation layer 200 and first gate conductive layer 300 may be sequentially formed on SOI substrate 100. First mask pattern 410 may then be formed. SOI substrate 100 may include middle insulation layer 130 and silicon layer 150 on substrate 110.

Figure 2:
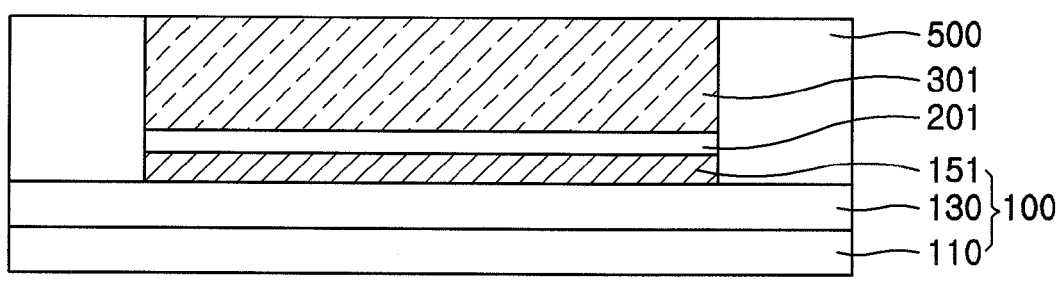

Referring to FIG. 2, first gate conductive layer 300, gate insulation layer 200, and silicon layer 150 of SOI substrate 100 may be etched, for example by a dry etching method, using first mask pattern 410. First gate conductive layer pattern 301, gate insulation layer pattern 201, and silicon layer pattern 151 may accordingly be formed. First mask pattern 410 may be removed, and a first insulation layer may be deposited. The first insulation layer may have a thickness of approximately 2000 to 5000 Å. Device isolation insulation layer 500 may be formed, for example by using a chemical mechanical polishing (CMP) method.

In embodiments, when device isolation insulation layer 500 is formed using a CMP method, first gate conductive layer pattern 301 may be used as a CMP stop layer.

Figure 3:
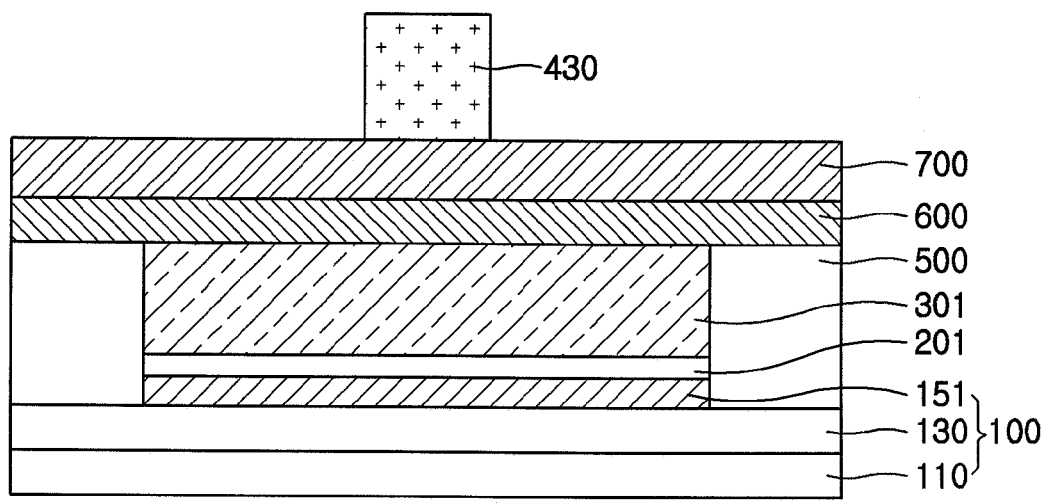

Referring to FIG. 3, second gate conductive layer 600 and second mask insulation layer 700 may be sequentially deposited, and then third mask pattern 430 may be formed.

Figure 4:
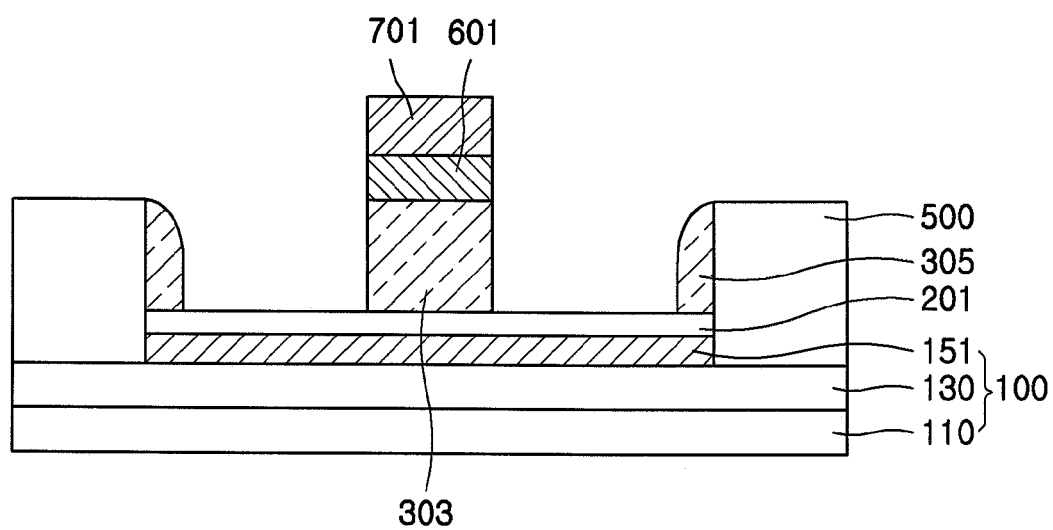

Referring to FIG. 4, second mask pattern 701 may be formed as a hard mask of silicon nitride, for example by a dry etching method using third mask pattern 430. Second gate pattern 601 and gate pattern 303 may be formed, for example by a dry etching process using second mask pattern 701. Third mask pattern 430 may then be removed.

In embodiments, when etching is performed by a dry etching method, gate insulation layer pattern 201 may be used as an etch stop layer. In embodiments, a remaining part of first gate conductive layer pattern 301 may remain on a sidewall of device isolation insulation layer 500 in a spacer form.

Figure 5:
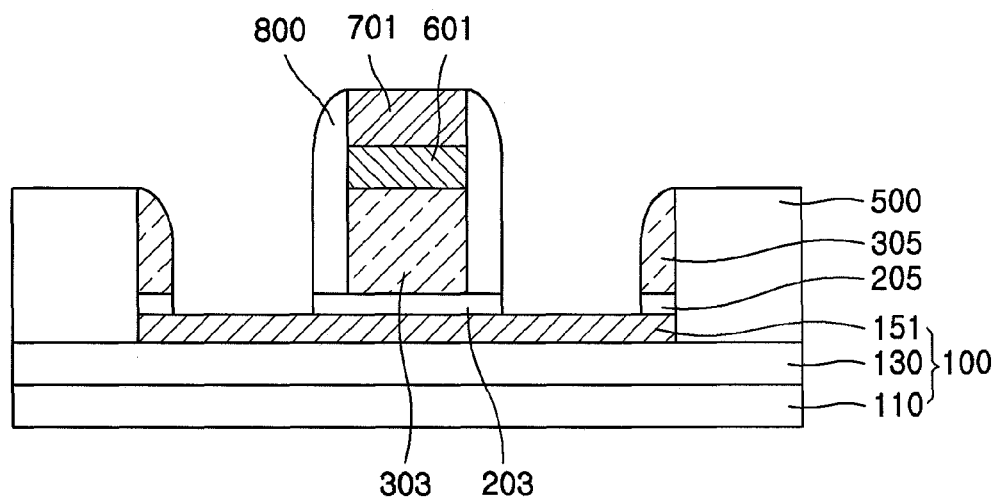

Referring to FIG. 5, a spacer layer of a silicon nitride insulation layer may be deposited. Spacer 800, gate insulation pattern 203, gate insulating layer pattern 205 and first gate conductive layer spacers 305 may be formed, for example by using an etch back method.

Figure 6:
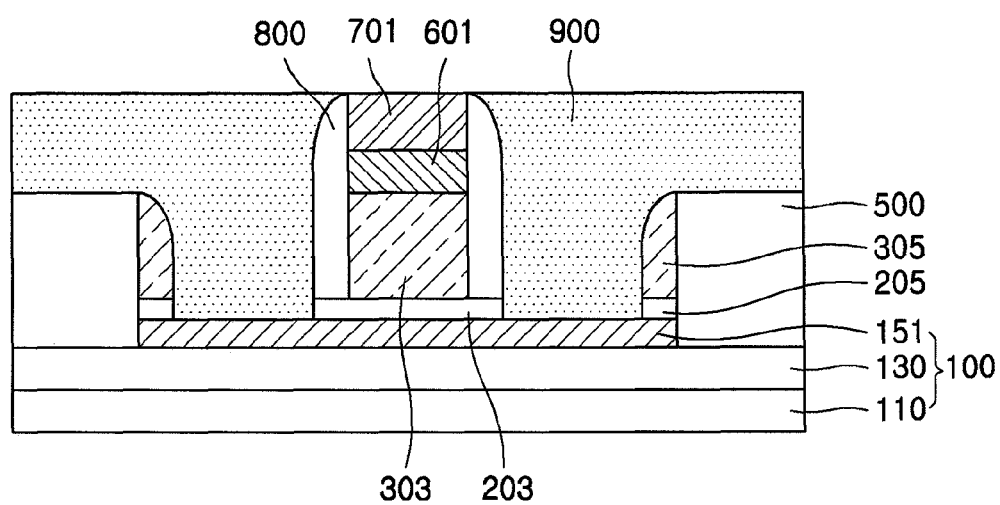

Referring to FIG. 6, a source/drain conductor may be deposited and planarized, for example by using a CMP method to form source/drain conductive layer 900. In embodiments, when source/drain conductive layer 900 is formed by using a CMP method, second mask pattern 701 may be used as a CMP stop layer.

Figure 7:
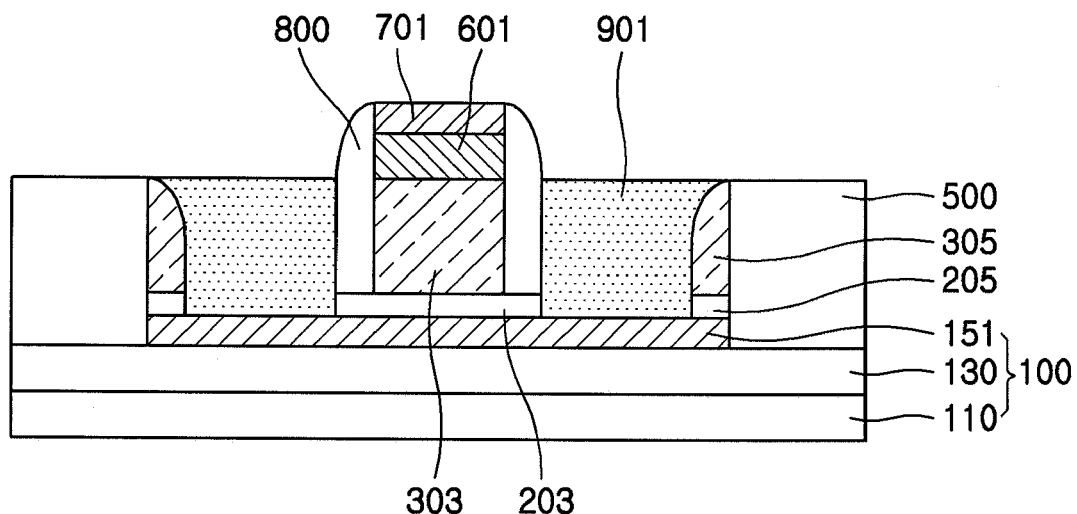

Referring to FIG. 7, the source/drain conductive layer 900 may be recessed, for example by using an etch back method to form recessed source/drain conductive layer 901 and to expose side of the spacer 800.

Figure 8:
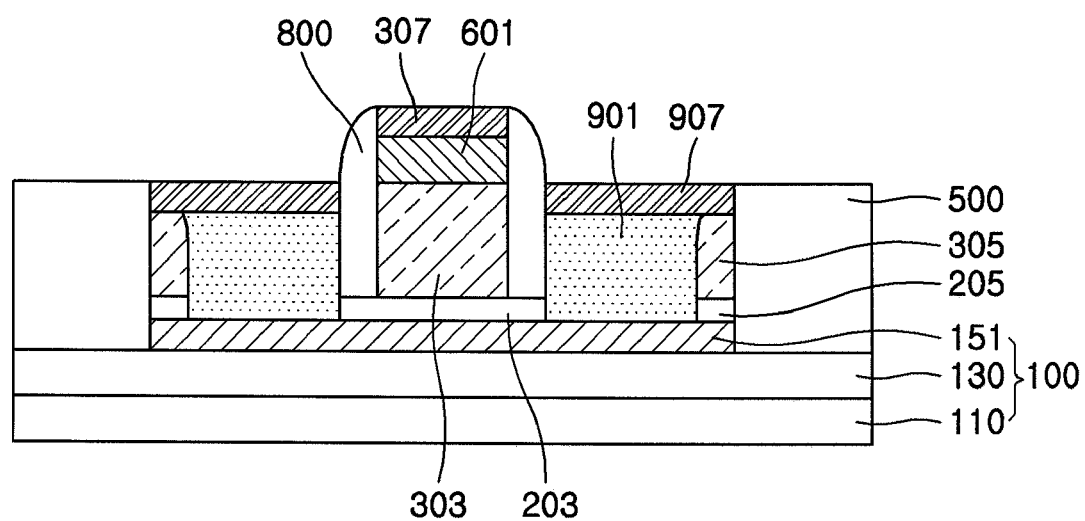

Referring to FIG. 8, after removing second mask pattern 701, for example by wet etching, salicide may be formed on exposed source/drain conductive layer 901 and second gate pattern 601. First salicide layer 307 may thus be formed on second gate pattern 601, and second salicide layer 907 may thus be formed on source/drain conductor 901.

A layer for the first and second gates, and source and drain conductive layers may be may be formed including an identical conductive layer, e.g., a polysilicon layer.

Additionally, salicide layers 307 and 907 may be formed including one of Ti-based salicide, Co-based salicide, Ta-based salicide, and Ni-based salicide.

According to embodiments, it may be possible to reduce resistance in a source/drain region. Additionally, stress due to a STI process may be minimized. Moreover, device reliability may be improved by preventing a divot phenomenon caused by a related art STI process. A leakage current by a STI edge during a related art STI process may be minimized.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A transistor with raised source and drain formed on SOI substrate comprising:
   an SOI substrate including a substrate layer, a middle insulation layer, and a silicon layer pattern;
   device isolation insulation layers over and contacting the middle insulation layer, and beside and contacting the silicon layer pattern;
   a gate insulation layer formed over a portion of the silicon layer pattern;
   a gate insulation layer pattern formed beside the device isolation insulation layers and apart from the gate insulation layer and having the same height and material with the gate insulation layer;
   a gate electrode including a first gate conductive layer pattern formed over a portion of the gate insulation layer and a second gate conductive layer pattern formed over the first gate conductive layer pattern;
   a first gate conductive layer spacers formed on and contacting the gate insulation layer pattern and a sidewall of the device isolation insulation layers and having same material with the first gate conductive layer pattern;
   a insulation layer spacers formed adjacent to sides of the gate electrode and over a portion of the gate insulation layer;
   source and drain conductive layer formed over the silicon layer pattern and beside the gate insulation layer, the gate insulation layer pattern, the first gate conductive layer spacers and a portion of the insulation layer spacers; and
   a salicide layer formed over each of the gate electrode and the source and drain conductive layer.

2. The transistor of claim 1, wherein the first gate conductive layer pattern and the second gate conductive layer pattern each comprise a polysilicon layer.

3. The transistor of claim 1, wherein the first gate conductive layer spacers comprise a polysilicon layer.

4. The transistor of claim 1, wherein the salicide layer is formed over a top surface of the first gate conductive layer spacers, source and drain conductive layer.

5. The transistor of claim 1, wherein the salicide layer comprises at least one of Ti-based salicide, Co-based salicide, Ta-based salicide, and Ni-based salicide.

6. A device comprising:
   an SOI substrate, including a substrate layer, a middle insulation layer, and a silicon layer;
   device isolation insulation layers over and contacting the middle insulation layer;
   a gate insulating layer formed over a portion of the SOI substrate;
   a gate electrode formed over a first portion of the gate insulating layer;
   a first gate conductive layer spacers on and contacting a second portion of the gate insulating layer and a sidewall of the device isolation insulation layers;
   insulating sidewalls formed adjacent to sides of the gate electrode and over the gate insulating layer;
   source and drain regions formed over the SOI substrate and between and contacting the first gate conductive layer spacers and over and contacting the silicon layer; and
   a salicide layer formed over each of the gate electrode and the source and drain regions,
   wherein the insulating sidewalls is spaced apart from the respective first gate conductive layer spacers and are formed on and contacting sidewalls of the gate electrode.

7. The device of claim 6, wherein the gate electrode comprises a first gate conductive layer formed over the gate insulator layer and a second gate conductive layer formed over the first gate conductive layer.

8. The device of claim 7, wherein the device isolation insulation layers are spaced apart from the first and the second gate conductive layer.

9. The device of claim 7, wherein the first gate conductive layer and the second gate conductive layer each comprise a polysilicon layer.

10. The device of claim 6, wherein the first gate conductive layer spacers comprise a conductive material.

11. The device of claim 10, wherein the conductive material is identical to the gate electrode.

12. The device of claim 10, wherein the conductive material is a polysilicon.

13. The device of claim 6, wherein the salicide layer is formed over a top surface of the first gate conductive layer spacers.

14. The device of claim 6, wherein the salicide layer comprises at least one of Ti-based salicide, Co-based salicide, Ta-based salicide, and Ni-based salicide.

* * * * *